United States Patent
Yang et al.

(10) Patent No.: US 7,960,229 B2
(45) Date of Patent: Jun. 14, 2011

(54) METAL OXIDE SEMICONDUCTOR TRANSISTOR WITH REDUCED GATE HEIGHT, AND RELATED FABRICATION METHODS

(75) Inventors: Frank Bin Yang, Mahwah, NJ (US); Rohit Pal, Fishkill, NY (US); Scott Luning, Poughkeepsie, NY (US)

(73) Assignee: GlobalFoundries Inc., Grand Cayman (KY)

( * ) Notice: Subject to any disclaimer, the term of this patent is extended or adjusted under 35 U.S.C. 154(b) by 422 days.

(21) Appl. No.: 12/100,598

(22) Filed: Apr. 10, 2008

(65) Prior Publication Data
US 2009/0256201 A1    Oct. 15, 2009

(51) Int. Cl.
*H01L 21/336* (2006.01)
(52) U.S. Cl. ........ 438/259; 438/149; 438/479; 438/517; 257/345; 257/E29.201

(58) Field of Classification Search ............... 257/345; 438/149, 259, 479, 517
See application file for complete search history.

(56) References Cited

U.S. PATENT DOCUMENTS

| | | | |
|---|---|---|---|
| 6,787,850 B1 * | 9/2004 | Pelloie | 257/347 |
| 2008/0001170 A1 * | 1/2008 | Lindert et al. | 257/190 |

* cited by examiner

*Primary Examiner* — Wai-Sing Louie
(74) *Attorney, Agent, or Firm* — Ingrassia Fisher & Lorenz, P.C.

(57) ABSTRACT

A metal oxide semiconductor transistor device having a reduced gate height is provided. One embodiment of the device includes a substrate having a layer of semiconductor material, a gate structure overlying the layer of semiconductor material, and source/drain recesses formed in the semiconductor material adjacent to the gate structure, such that remaining semiconductor material is located below the source/drain recesses. The device also includes shallow source/drain implant regions formed in the remaining semiconductor material, and epitaxially grown, in situ doped, semiconductor material in the source/drain recesses.

10 Claims, 7 Drawing Sheets

METAL OXIDE SEMICONDUCTOR TRANSISTOR WITH REDUCED GATE HEIGHT, AND RELATED FABRICATION METHODS

TECHNICAL FIELD

Embodiments of the subject matter described herein relate generally to semiconductor devices. More particularly, embodiments of the subject matter relate to metal oxide semiconductor transistors having reduced gate height, and methods of fabricating such transistors.

BACKGROUND

The majority of present day integrated circuits (ICs) are implemented by using a plurality of interconnected field effect transistors (FETs), which may be realized as metal oxide semiconductor field effect transistors (MOSFETs or MOS transistors). A MOSFET includes a gate electrode as a control electrode that is formed over a semiconductor substrate, and spaced-apart source and drain regions formed within the semiconductor substrate and between which a current can flow. The source and drain regions are typically accessed via respective conductive contacts formed on the source and drain regions. Bias voltages applied to the gate electrode, the source contact, and the drain contact control the flow of current through a channel in the semiconductor substrate between the source and drain regions beneath the gate electrode. Conductive metal interconnects (plugs) formed in an insulating layer are typically used to deliver bias voltages to the gate, source, and drain contacts.

In a MOSFET, capacitance is present between the conductive metal interconnects and the conductive portion of the gate stack. This undesired capacitance can adversely affect the performance of the MOSFET. This capacitance is roughly proportional to the height of the conductive gate stack. Accordingly, reducing the height of the gate structure has been identified as one of the most effective ways of reducing this capacitance. Unfortunately, the gate height has reached a scaling barrier due to the practical limitations and constraints of conventional semiconductor fabrication processes technologies.

BRIEF SUMMARY

A method of fabricating a semiconductor device is provided herein. The method involves providing a substrate having a layer of semiconductor material, forming a gate structure overlying the layer of semiconductor material, forming recesses in the layer of semiconductor material adjacent to the gate structure, with remaining semiconductor material below the recesses, and forming shallow source/drain implant regions in the remaining semiconductor material.

An embodiment of a method of fabricating a semiconductor device involves providing a silicon-on-insulator (SOI) substrate comprising a buried oxide layer and a layer of silicon material on the buried oxide layer, and forming a device structure on the SOI substrate, the device structure comprising a gate stack overlying the layer of silicon material, and the device structure comprising source/drain extension implant regions in the layer of silicon material. The method continues by forming recesses in the layer of semiconductor material adjacent to the gate structure, while leaving remaining semiconductor material below the recesses. Thereafter, the method at least partially fills the recesses with in situ doped semiconductor material.

An embodiment of a semiconductor device includes a substrate having a layer of semiconductor material, a gate structure overlying the layer of semiconductor material, and source/drain recesses formed in the semiconductor material adjacent to the gate structure, such that remaining semiconductor material is located below the source/drain recesses. The semiconductor device also includes source/drain implant regions formed in the remaining semiconductor material, and epitaxially grown, in situ doped, semiconductor material in the source/drain recesses.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor based transistors are well known and so, in the interest of brevity, many conventional steps will only be mentioned briefly herein or will be omitted entirely without providing the well known process details.

The techniques and technologies described herein may be utilized to fabricate metal oxide semiconductor (MOS) transistor devices, including NMOS transistor devices, PMOS transistor devices, and CMOS transistor devices. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

Figure 1:
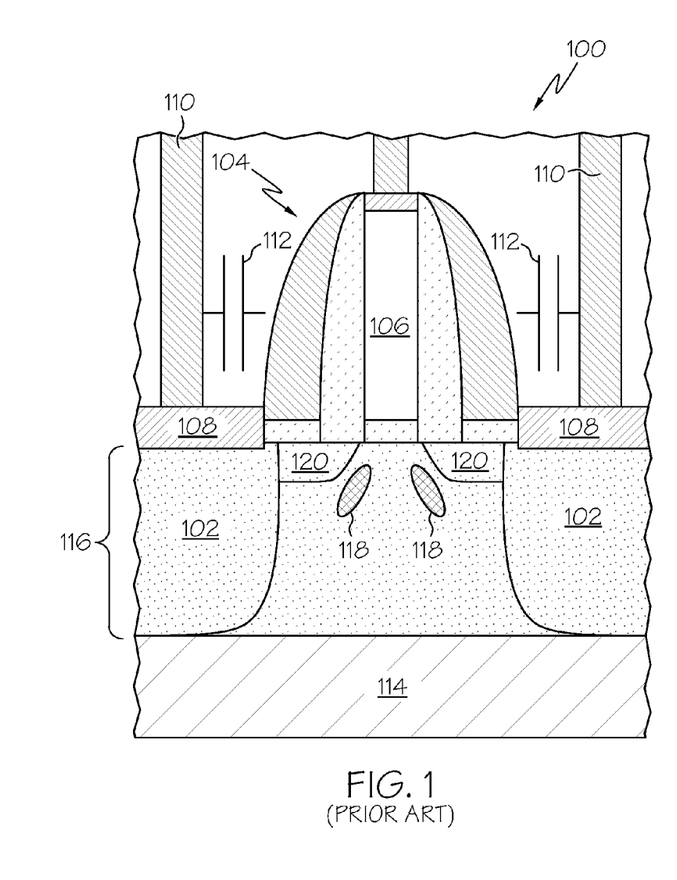
FIG. 1 is a cross sectional view of a conventional MOSFET having deep source/drain implants.

Reduction in MOSFET gate stack height has been identified as one of the most effective ways to lower the capacitance between the gate electrode and the conductive source/drain plugs. Reducing this capacitance results in a lower effective capacitance for the MOSFET device, which results in improved performance. FIG. 1 is a cross sectional view of a conventional MOSFET 100 having deep source/drain implants 102. MOSFET 100 includes a relatively tall gate structure 104 that includes a polycrystalline silicon gate 106, source/drain contacts 108, and conductive plugs 110 for source/drain contacts 108. The capacitors 112 shown in FIG. 1 represent the undesirable plug to gate electrode capacitance. MOSFET 100 employs a silicon-on-insulator (SOI) substrate having a buried oxide layer 114 and a layer of silicon material 116 on buried oxide layer 114. As depicted in FIG. 1, deep source/drain implants 102 are butted implants in that they both extend down to buried oxide layer 114. Butted source/drain implants can be desirable to reduce the junction capacitance of the device.

As is well understood in the electronics field, capacitance of a parallel plate capacitor is proportional to the area of the parallel plates. Thus, the plug-to-gate capacitance of MOSFET 100 is roughly proportional to the area defined by the sides of the conductive gate electrode (in gate structure 104) that oppose conductive plugs 110. Reducing the height of gate structure 104 results in a corresponding reduction in the area defined by the sides of gate structure 104 and, therefore, results in a corresponding reduction in the plug-to-gate capacitance. It has been possible to reduce gate height along with the development of small scale fabrication processes. For example, gate heights on the order of 150 nm can be obtained with 90 nm node technology, gate heights on the order of 100 nm can be obtained with older 45 nm node technology, gate heights on the order of 80 nm can be obtained with newer 45 nm node technology, and gate heights on the order of 70 nm can be obtained with 32 nm node technology. As explained above, it is desirable to even further reduce the effective capacitance of MOSFET devices for 32 nm node technology (and beyond). However, the gate height can reach a scaling barrier due to practical limitations of conventional fabrication processes.

Referring again to FIG. 1, MOSFET 100 is conventionally manufactured such that gate structure 104 serves as a self aligned hard mask that protects certain areas of silicon material 116 during the formation of deep source/drain implants 102, halo implants 118, and source/drain extension implants 120. Such usage requires a specified minimum gate height, otherwise some of the silicon material 116 underlying gate structure 104 will be inadvertently subjected to ion implantation. In practice, source/drain implants 102 may be about 600 Angstroms or deeper. Accordingly, the minimum height of gate structure 104 must also be at least 600 Angstroms.

Figure 2:
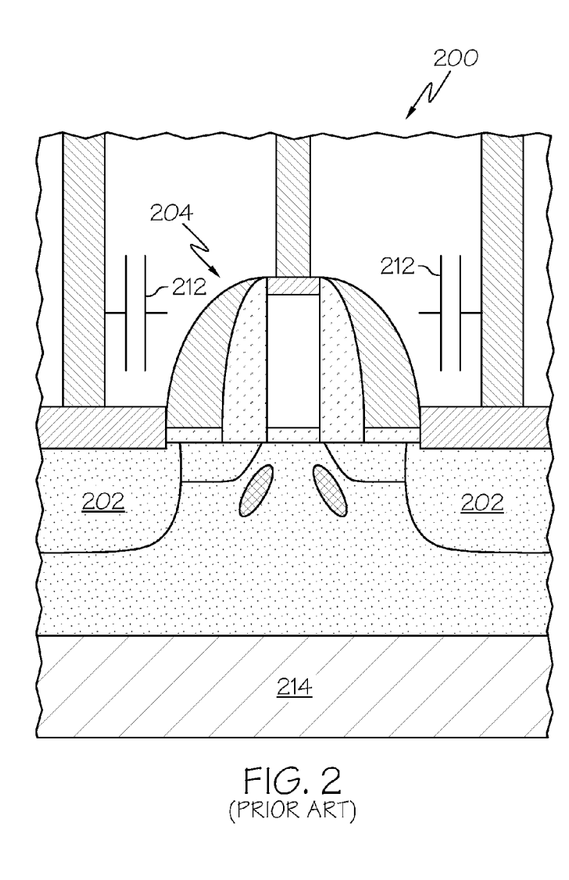
FIG. 2 is a cross sectional view of a conventional MOSFET having reduced gate stack height and having shallow source/drain implants.

The minimum gate height requirement is also illustrated in FIG. 2, which is a cross sectional view of a conventional MOSFET 200 having reduced gate height. Notably, MOSFET 200 utilizes shallow source/drain implants 202, relative to MOSFET 100. In contrast to that depicted in FIG. 1, MOSFET 200 employs a relatively short gate structure 204, which results in a lower plug-to-gate capacitance. This reduced plug-to-gate capacitance is represented by the smaller sized capacitors 212 in FIG. 2. Although the plug-to-gate capacitance is less, the depth of source/drain implants 202 is correspondingly limited by the reduced gate height. As a result, source/drain implants 202 are not butted against the buried oxide layer 214; this results in higher source-to-drain resistance and higher P-N junction capacitance, both of which are undesirable.

The semiconductor device fabrication techniques and resulting device architectures described below enable further reductions in gate height without resulting in increased source-to-drain resistance, and without resulting in increased junction capacitance. The techniques described here can be utilized in connection with 32 nm node technology to manufacture MOS transistors with a gate height of less than 70 nm. Indeed, it may be possible to achieve a gate height of about 30 nm or less using the techniques and technologies described below.

Figure 3:
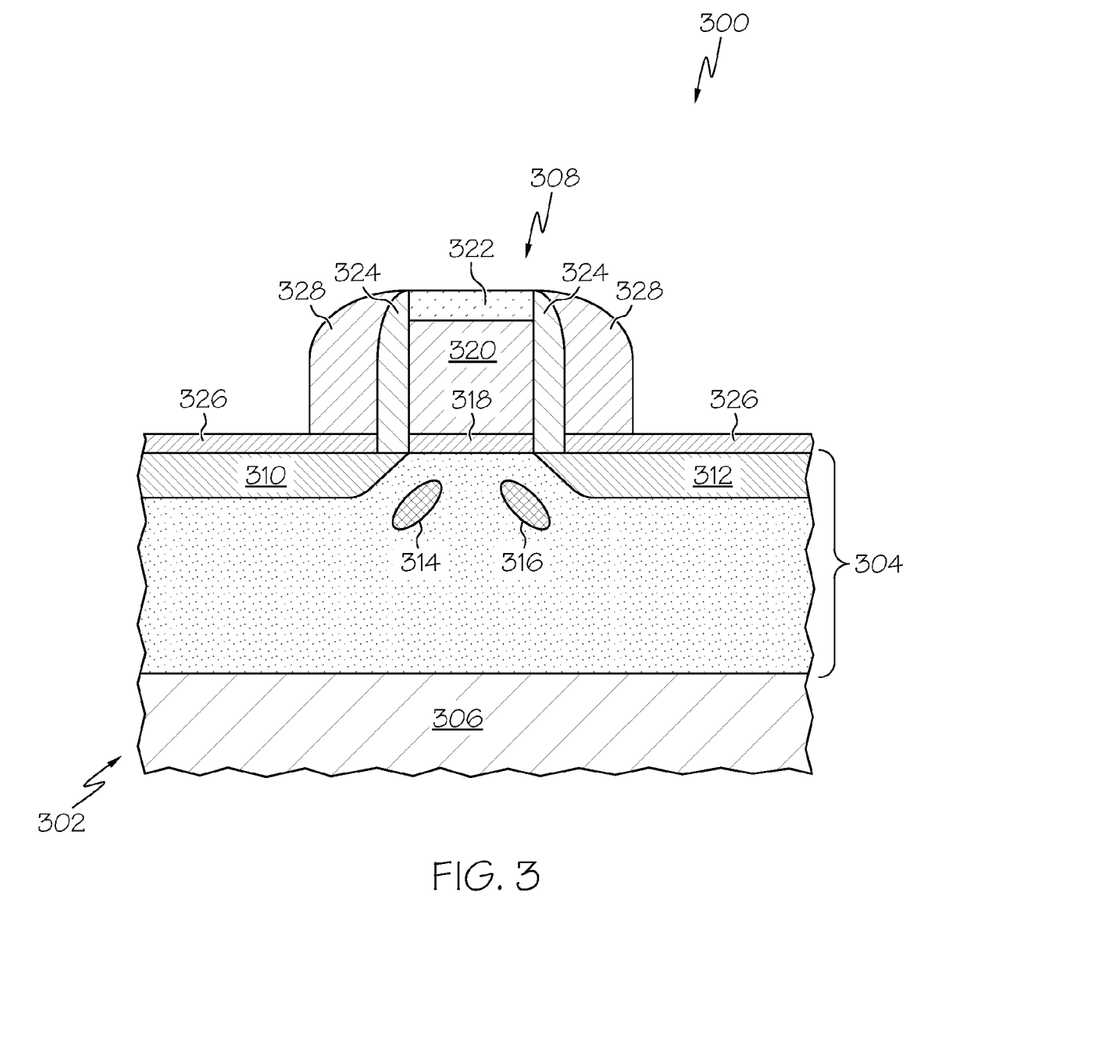
FIGS. 3-8 are cross sectional views that illustrate an embodiment of a semiconductor device structure and an exemplary method of fabricating the structure.

FIGS. 3-8 are cross sectional views that illustrate an embodiment of a semiconductor device structure and an exemplary method of fabricating the structure. For this particular example the semiconductor device structure is an NMOS transistor device. However, the manufacturing process described here can also be utilized to fabricate PMOS transistor devices. The description of well known and conventional steps related to the fabrication of semiconductor devices may be briefly summarized or omitted entirely without providing the well known process details. In this regard, FIG. 3 depicts an intermediate state in the fabrication process after formation of a suitably configured device structure 300. Device structure 300 is formed using well known techniques and process steps (e.g., techniques and steps related to doping, photolithography and patterning, etching, material growth, material deposition, surface planarization, and the like), which will not be described in detail here.

Fabrication of device structure 300 may begin by providing a suitable substrate 302 having a layer of semiconductor material 304. For this embodiment, substrate 302 is realized as an SOI substrate, where semiconductor material 304 is disposed on a layer of insulator material 306 that, in turn, is supported by a carrier wafer (not shown). More specifically, semiconductor material 304 is a silicon material having a thickness of about 75 nm, and insulator material 306 is a buried oxide layer. For this embodiment, insulator material 306 is realized as a layer of silicon oxide ($SiO_2$). In alternate embodiments, device structure 300 can be formed on a bulk silicon substrate rather than an SOI substrate.

Semiconductor material 304 is preferably a monocrystalline silicon material, which may be any of the generally monocrystalline and relatively pure silicon materials typically used in the semiconductor industry. Semiconductor material 304 can be either N-type or P-type, but is typically P-type, as described here for this NMOS transistor embodiment. The wafer is subjected to various process steps to form device structure 300 depicted in FIG. 3. For this simplified depiction, device structure 300 includes, without limitation: a gate structure 308 overlying semiconductor material 304; source/drain extension implant regions 310/312 formed in semiconductor material 304; and tilted halo implant regions 314/316 formed in semiconductor material 304.

As a brief summary, device structure 300 can be fabricated as follows. A gate stack (including, for example, a gate insulator 318, a polycrystalline or amorphous silicon gate electrode 320, and a silicon nitride cap 322) is formed using known material deposition, photolithography, etching, and possibly other steps. In certain embodiments, gate structure 308 is formed such that its height is less than about 70 nm. When 32 nm node technology is used to fabricate device structure 300, it may be possible to reduce the height of gate structure 308 to 30 nm or less. After formation of the gate stack, offset spacers 324 are formed from an insulator material, such as an oxide material (preferably, silicon oxide).

Offset spacers 324 are formed using known material deposition, etching, and possibly other steps. The gate stack and offset spacers 324 are then used as an ion implant mask during the formation of tilted halo implant regions 314/316 and during the formation of source/drain extension implant regions 310/312. For this particular embodiment, tilted halo implant regions 314/316 are highly doped P-type regions, and source/drain extension implant regions 310/312 are very shallow, highly doped N-type regions. Formation of tilted halo implant regions 314/316 is typically controlled such that tilted halo implant regions 314/316 are generally located under gate structure 308. Moreover, for this embodiment, tilted halo implant regions 314/316 are only about 24-30 nm deep. On the other hand, source/drain extension implant regions 310/312 are only about 10-20 nm deep. Consequently, the gate height needed to block halo and extension implants is approximately 30 nm.

Next, a layer of insulator material (preferably, the same material used to form offset spacers 324) is deposited to form oxide liner 326. Oxide liner 326 serves as an etch stop for the formation of disposable spacers, which are formed from an insulator material, such as silicon oxide and/or silicon nitride, preferably silicon nitride. As shown in FIG. 3, disposable spacers 328 cover the sides of offset spacers 324 and cover the portions of insulator layer 326 that are immediately adjacent to offset spacers 324. Disposable spacers 328 are formed using known material deposition, etching, and possibly other steps. At this time, a rapid thermal annealing step may be performed to diffuse the implanted dopant in semiconductor material 304. Alternatively, annealing may take place before the formation of insulator layer 326 and disposable spacers 328.

Figure 4:
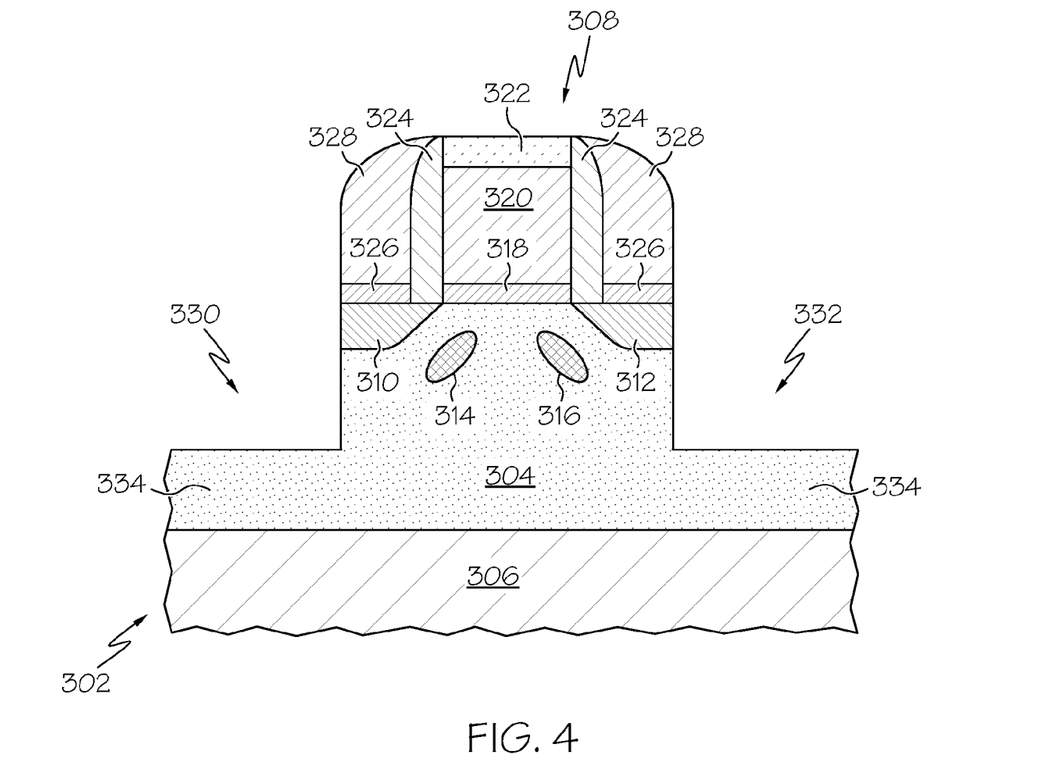

Although other fabrication steps or sub-processes may be performed after device structure 300 is provided, this example continues with an etching step, which preferably employs an anisotropic etch technique. In accordance with this embodiment, the gate stack, offset spacers 324, and disposable spacers 328 are used as a hard etch mask to form recesses 330/332 in semiconductor material 304 (FIG. 4). This etching step is controlled to form recesses 330/332 having a desired depth and such that an appropriate amount of remaining semiconductor material 334 is located below recesses 330/332 (i.e., remaining semiconductor material 334 is present between recesses 330/332 and insulator material 306. As depicted in FIG. 4, recesses 330/332 are located adjacent to gate structure 308. Moreover, formation of recesses 330/332 involves the selective removal of portions of insulator layer 326, and the selective removal of portions of source/drain extension implant regions 310/312. As a result of this etching step, the remaining portions of source/drain extension implant regions 310/312 are located below gate structure 308.

In preferred embodiments, remaining semiconductor material 334 has a thickness within the range of 15-25 nm, and is preferably less than 20 nm. For the example described above, where the thickness of semiconductor material 304 under gate structure 308 is about 75 nm, recesses 330/332 are etched to a depth of about 60 nm, leaving about 15 nm of remaining semiconductor material 334.

Figure 5:
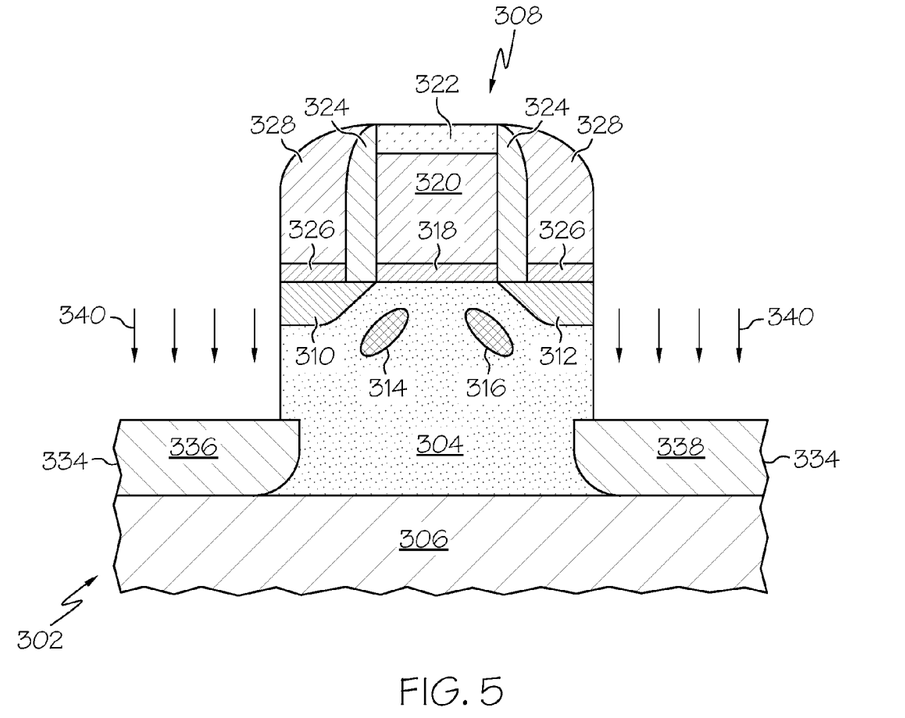

Although other fabrication steps or sub-processes may be performed after the creation of recesses 330/332, this example continues with an ion implantation step that forms shallow source/drain implant regions 336/338 in remaining semiconductor material 334 (FIG. 5). The gate stack, offset spacers 324, and disposable spacers 328 are used as an ion implantation mask that enables the formation of shallow source/drain implant regions 336/338 by impurity doping remaining semiconductor material 334 in a known manner, for example, by ion implantation of dopant ions (illustrated by arrows 340 in FIG. 5). Since the gate and the substrate are formed of the same material—silicon—each has the same stopping characteristic for the implanted ions. For the NMOS transistor device described here, shallow N-type source/drain implant regions 336/338 are formed by implanting ions of a suitable impurity, such as phosphorus or arsenic ions. For a PMOS transistor device, shallow P-type source/drain implant regions are formed by implanting ions of a suitable impurity, such as boron ions.

For the embodiment illustrated in FIG. 5, the ion implantation step utilizes sufficient energy to ensure that shallow source/drain implant regions 336/338 extend to, and are butted against, the layer of insulator material 306. The relatively thin layer of remaining semiconductor material 334 makes it possible to form butted source/drain implant regions in this manner, even though gate structure 308 is relatively short. Indeed, shallow source/drain implant regions 336/338 are formed such that they have a depth that is less than the height of gate structure 308. For this particular example, shallow source/drain implant regions 336/338 are approximately 15-20 nm deep. As mentioned previously, butted source/drain implant regions are desirable to reduce P-N junction capacitance in the device.

Figure 6:
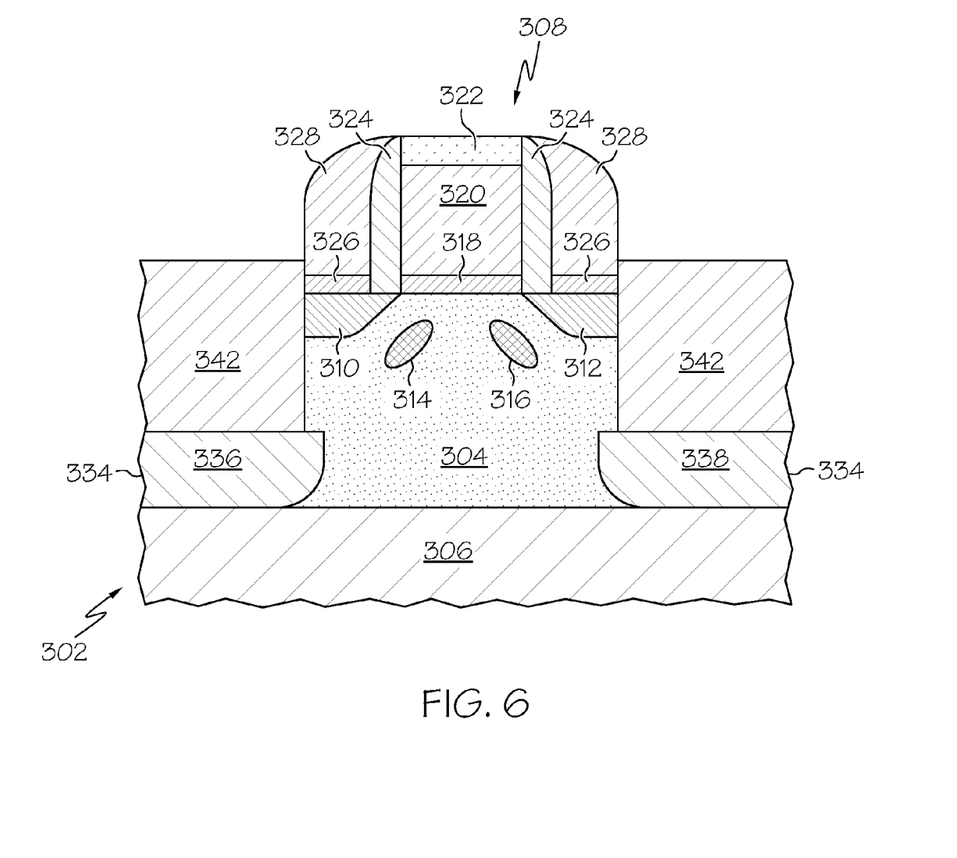

After formation of shallow source/drain implant regions 336/338, thermal annealing may be performed to treat and condition semiconductor material 304 and remaining semiconductor material 334. Although other fabrication steps or sub-processes may be performed at this time, this example continues by at least partially filling recesses 330/332 with doped semiconductor material 342 (FIG. 6). In this embodiment, doped semiconductor material 342 is formed by epitaxially growing an in situ doped silicon material in recesses 330/332. As used here, "in situ doped" means that a suitable dopant is introduced into a host material as that host material is grown. Epitaxially grown in situ doped silicon material is utilized here such that the material need not be subjected to ion implantation for purposes of doping. This characteristic is important when, as here, the depth of in situ doped semiconductor material 342 is greater than the height of gate structure 308. In other words, the reduced height of gate structure 308 would not be able to serve as an effective ion implant block.

For an NMOS transistor device (as described here), the in situ doped semiconductor material 342 is an N-type semiconductor material, such as in situ phosphorus doped silicon carbon, other materials that have a lower lattice constant than silicon, such as a compound semiconductor, or the like. In contrast, for a PMOS transistor device, the in situ doped semiconductor material 342 is a P-type semiconductor material, such as in situ boron doped silicon germanium, other materials that have a higher lattice constant than silicon, such as a compound semiconductor, or the like. Notably, the combination of shallow source/drain implant regions 336/338 and the overlying in situ doped semiconductor material 342 functions in a manner equivalent to deep and butted source/drain implant regions.

Figure 7:
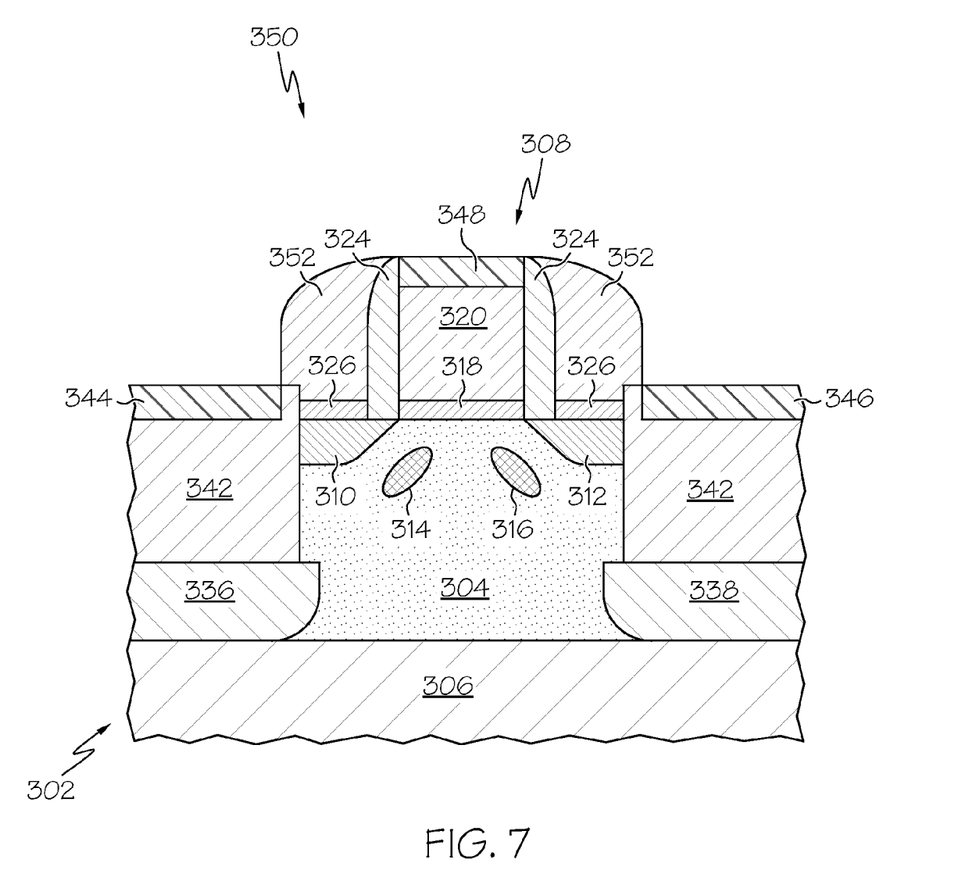

Although other fabrication steps or sub-processes may be performed at this time, this example continues by forming metal silicide contact areas 344/346 on in situ doped semiconductor material 342. In addition, a metal silicide contact area 348 is formed on polycrystalline silicon gate electrode 320. In this regard, FIG. 7 depicts a device structure 350 after a number of known process steps have been performed. For the sake of brevity, these intermediate steps will not be described in detail. Device structure 350 may be obtained by first selectively removing silicon nitride cap 322 and disposable spacers 328 (both shown in FIG. 6). This can be accomplished using a selective etch process, for example, a hot phosphoric acid etch that selectively etches silicon nitride. Next, final spacers 352 are formed from an insulator material, such as silicon oxide and/or silicon nitride, preferably silicon nitride. In the illustrated embodiment, final spacers 352 cover the sides of offset spacers 324, cover the remaining portions of insulator layer 326, and cover a portion of in situ doped semiconductor material 342. Final spacers 352 are formed using known material deposition, etching, and possibly other steps.

After formation of final spacers 352, an appropriate silicidation process is performed to create metal silicide contact areas 344/346/348. For example, a layer of silicide-forming metal (not shown) is deposited onto the surface of in situ doped semiconductor material 342 and onto the surface of gate electrode 320. The silicide-forming metal can be deposited, for example, by sputtering to a thickness of about 5-50 nm and preferably to a thickness of about 10 nm. The wafer is then heated, for example by rapid thermal annealing, to form metal silicide contact areas 344/346/348. The silicide-forming metal can be, for example, cobalt, nickel, rhenium, ruthenium, or palladium, or alloys thereof. Any silicide-forming metal that is not in contact with exposed silicon does not react during heating and, therefore, does not form a silicide. This excess metal may be removed by wet etching or any suitable procedure.

Figure 8:
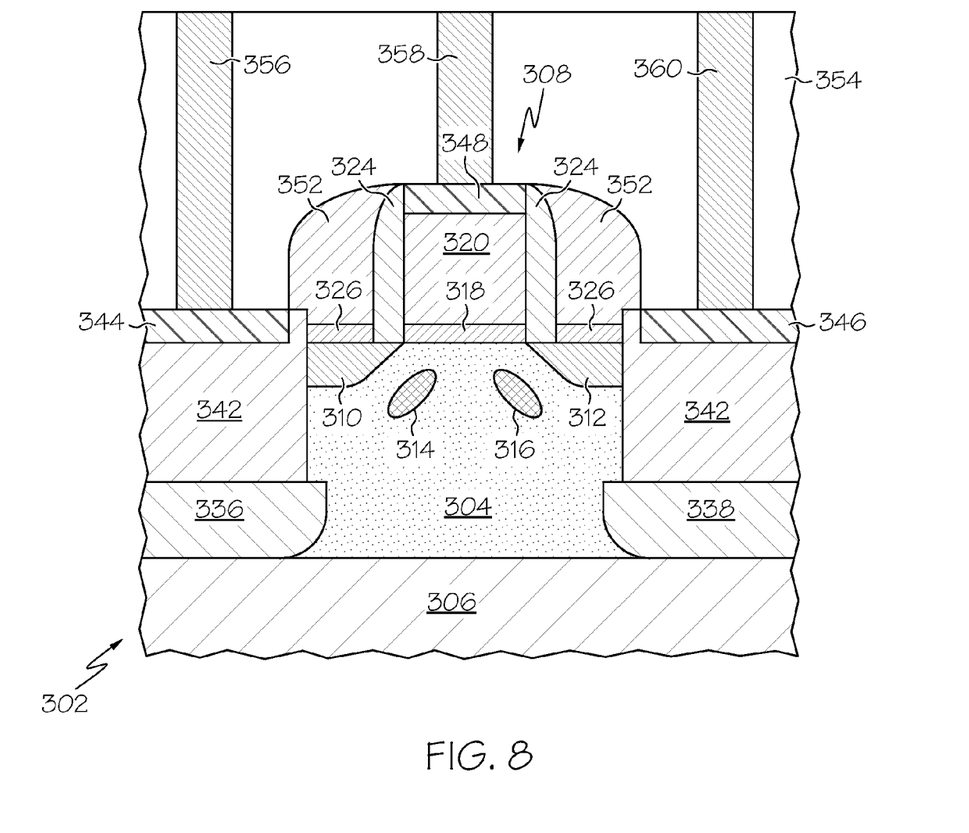

Thereafter, any number of known process steps can be performed to complete the fabrication of the NMOS transistor device. Referring to FIG. 8, although other fabrication steps or sub-processes may be performed at this time, this example continues by forming an insulating layer 354 over gate structure 308, over in situ doped semiconductor material 342, and over metal silicide contact areas 344/346/348. Insulating layer 354 may be formed from one or more suitable dielectric materials, for example, an oxide material, nitride or other low-k materials, or the like. The insulating layer 354 can then be polished (planarized), patterned, and etched to define vias (holes) above metal silicide contact areas 344/346/348. Thereafter, conductive plugs 356/358/360 are formed in the insulating layer 354 by depositing metal, such as tungsten, in the via holes. As depicted in FIG. 8, conductive plug 356 contacts metal silicide contact area 344, conductive plug 358 contacts metal silicide contact area 348, and conductive plug 360 contacts metal silicide contact area 346. Conductive metal traces/lines can be formed as needed to establish electrical contact with conductive plugs 356/358/360. Such conductive metal traces/lines are typically formed in the Metal-1 (M1) layer of the semiconductor device.

A MOS transistor device can be manufactured in this manner with a gate height of only 30 nm (or less in certain embodiments), resulting in reduced plug-to-gate capacitance. Moreover, the MOS transistor device can be manufactured with butted source/drain implant regions, which reduces leakage, reduces P-N junction capacitance, and enhances performance. As mentioned previously, a PMOS transistor device can be fabricated in a similar manner. Moreover, the techniques and technologies described above can be utilized to fabricate a CMOS transistor device having NMOS transistors, PMOS transistors, and an isolation region separating NMOS transistors from PMOS transistors.

Although the embodiment described above uses an SOI substrate, the fabrication technique may also be utilized for devices formed on a bulk silicon substrate. When using a bulk silicon substrate, however, the shallow source/drain implant regions will no longer be butted against a buried oxide layer. Therefore, certain benefits related to reduced P-N junction capacitance may not be realized. However, it will still be possible to create a MOS transistor device having a significantly reduced gate height and an associated reduction in plug-to-gate capacitance.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of fabricating a semiconductor device, the method comprising:
   providing a silicon-on-insulator (SOI) substrate having a layer of insulator material and a layer of semiconductor material on the layer of insulator material;
   forming a gate structure overlying the layer of semiconductor material;
   forming recesses in the layer of semiconductor material adjacent to the gate structure, with remaining semiconductor material below the recesses; and
   forming butted source/drain implant regions in the remaining semiconductor material that extend to the layer of insulator material; and
   at least partially filling the recesses with in situ doped semiconductor material, after forming the butted source/drain implant regions.

2. The method of claim 1, wherein at least partially filling the recesses comprises epitaxially growing the in situ doped semiconductor material in the recesses.

3. The method of claim 1, wherein:
   forming butted source/drain implant regions comprises forming butted N-type source/drain implant regions; and
   at least partially filling the recesses comprises at least partially filling the recesses with N-type semiconductor material.

4. The method of claim 1, wherein:
   forming butted source/drain implant regions comprises forming butted P-type source/drain implant regions; and
   at least partially filling the recesses comprises at least partially filling the recesses with P-type semiconductor material.

5. The method of claim 1, further comprising forming metal silicide contact areas on the in situ doped semiconductor material, after at least partially filling the recesses.

6. The method of claim 5, further comprising:
   forming an insulating layer over the gate structure, over the in situ doped semiconductor material, and over the metal silicide contact areas; and
   forming conductive plugs in the insulating layer, the conductive plugs contacting the metal silicide contact areas.

7. The method of claim 1, wherein:
   forming a gate structure overlying the layer of semiconductor material comprises forming the gate structure with a height of less than 70 nanometers; and
   forming butted source/drain implant regions in the remaining semiconductor material comprises forming the butted source/drain implant regions such that they have a depth that is less than the height of the gate structure.

8. A method of fabricating a semiconductor device, the method comprising:

provided a silicon-on-insulator (SOI) substrate comprising a buried oxide layer and a layer of silicon material on the buried oxide layer;

forming a device structure on the SOI substrate, the device structure comprising a gate structure overlying the layer of silicon material, and the device structure comprising source/drain extension implant regions in the layer of silicon material;

forming recesses in the layer of semiconductor material adjacent to the gate structure, while leaving remaining semiconductor material below the recesses;

forming butted source/drain implant regions in the remaining semiconductor material that extend to the buried oxide layer; and then epitaxially growing in situ doped semiconductor material in the recesses to at least partially fill the recesses with the in situ doped semiconductor material.

9. The method of claim 8, wherein forming butted source/drain implant regions comprises implanting ions of an impurity into the remaining semiconductor material.

10. The method of claim 8, further comprising forming metal silicide contact areas on the in situ doped semiconductor material, after at least partially filling the recesses.

* * * * *